United States Patent
Milkov et al.

(10) Patent No.: US 9,667,234 B1
(45) Date of Patent: May 30, 2017

(54) SLEW-RATE ENHANCED ENERGY EFFICIENT SOURCE FOLLOWER CIRCUIT

(71) Applicant: TELEDYNE SCIENTIFIC & IMAGING, LLC, Thousand Oaks, CA (US)

(72) Inventors: Mihail Milkov, Moorpart, CA (US); Jason Inman, Batavia, NY (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 15/349,452

(22) Filed: Nov. 11, 2016

(51) Int. Cl.
| H03K 3/00 | (2006.01) |
| H03K 5/04 | (2006.01) |
| H03K 17/687 | (2006.01) |

(52) U.S. Cl.
CPC ........... *H03K 5/04* (2013.01); *H03K 17/6871* (2013.01)

(58) Field of Classification Search
USPC ....................................................... 327/111
See application file for complete search history.

(56) References Cited

U.S. PATENT DOCUMENTS

| 3,688,208 | A | 8/1972 | Kandiah |
| 4,701,720 | A | 10/1987 | Monticelli |
| 5,177,451 | A | 1/1993 | Lehmann |
| 5,317,281 | A | 5/1994 | Vinn et al. |
| 5,325,069 | A | 6/1994 | Sundby |
| 5,471,171 | A | 11/1995 | Itakura et al. |
| 5,892,376 | A | 4/1999 | Tabatabai et al. |
| 6,243,066 | B1 * | 6/2001 | Murakami ........... G09G 3/2011 345/205 |
| 6,441,653 | B1 | 8/2002 | Spurlin |
| 6,570,411 | B1 * | 5/2003 | Bardsley .............. G11C 27/024 327/337 |
| 7,164,298 | B2 | 1/2007 | Sung |
| 7,265,593 | B2 | 9/2007 | Sung |
| 7,449,952 | B2 | 11/2008 | Yu et al. |
| 7,482,845 | B2 | 1/2009 | Lee et al. |
| 8,022,730 | B2 | 9/2011 | Huang |
| 8,350,740 | B2 * | 1/2013 | Akita ................... G11C 27/024 341/122 |
| 2006/0006915 | A1 | 1/2006 | Yan et al. |
| 2006/0145729 | A1 | 7/2006 | Luh |
| 2012/0068766 | A1 | 3/2012 | Buter et al. |
| 2012/0146716 | A1 | 6/2012 | Shi et al. |
| 2014/0240043 | A1 | 8/2014 | Narita |

* cited by examiner

*Primary Examiner* — Lincoln Donovan
*Assistant Examiner* — Patrick Chen
(74) *Attorney, Agent, or Firm* — Koppel, Patrick, Heybl & Philpott

(57) ABSTRACT

This invention pertains to a source follower circuit suitable for receiving and buffering an input voltage and providing the buffered input voltage to a sampling capacitor via a sampling switch. The source follower circuit employs a slew enhancement circuit which enables the source follower to have fast settling for both high-to-low and low-to-high transitions.

14 Claims, 5 Drawing Sheets

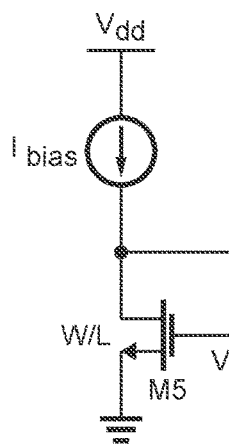
*FIG. 5A*
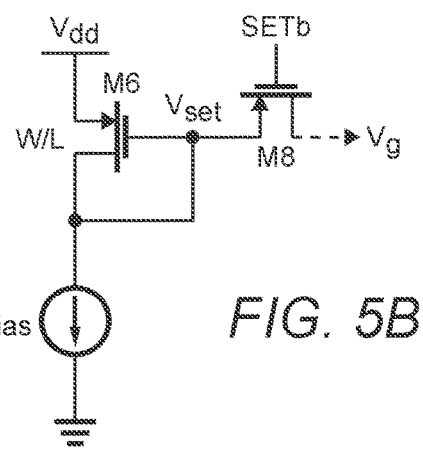
*FIG. 5B*
|  | SF (Prior Art) | SF+Precharge (Prior Art) | Slew-Enhanced SF |
|---|---|---|---|
| Bias Current, nA | 185 | 40 | 50 |
| Avg. Vdd Current, nA | 185.1 | 146.3 | 66.2 |
| Avg. Power, nW | 611 | 483 | 218 |
| Avg. Power, 4Kx4K array, 1000 fps, mW | 118 | 93 | 42 |
*FIG. 6*

SLEW-RATE ENHANCED ENERGY EFFICIENT SOURCE FOLLOWER CIRCUIT

GOVERNMENT LICENSE RIGHTS

This invention was made with Government support. The Government has certain rights in this invention.

BACKGROUND OF THE INVENTION

Field of the Invention

This invention relates to source follower circuits, and more particularly to circuitry for enhancing the slew rate of a source follower circuit used for buffering an input voltage and providing the buffered input voltage to a sampling capacitor via a sampling switch.

Description of the Related Art

Transistor source follower circuits are commonly used as simple voltage buffers in applications that do not require very high linearity. The DC characteristics of source follower circuits are such that the buffered output voltage tracks the input voltage except for a voltage shift equal to the gate-to-source voltage of the source follower transistor. The advantages of source follower circuits as buffers are low device count, low noise, unconditional stability and a relatively large signal swing. However, the transient response of source follower circuits suffers from an asymmetry in the settling speed. For example, an NMOS source follower has fast settling for a low-to-high transition and slow settling for a high-to-low transition; in the latter case the settling time is limited by the available bias current. This is explained in more detail in the following paragraph.

Consider the schematic and timing diagrams shown in FIGS. 1A and 1B, respectively. In FIG. 1A, a source follower circuit is formed from an NMOS input FET M1 which is connected in series with an NMOS bias FET M2 as shown. An input voltage to be buffered ($V_{in}$) is applied to the gate of M1, a bias voltage ($V_{bias}$) is applied to the gate of M2 (causing it to conduct a current $I_{bias}$), and the output ($V_{out}$) of the source follower circuit is provided at a junction 10 of M1 and M2. In this example, $V_{out}$ is sampled on a sampling capacitor $C_s$ when switch SAMPLE is closed; the voltage on $C_s$ is referred to as $V_s$.

The operation of the circuitry is shown in FIG. 1B. Within every sampling period $\Delta t$, switch SAMPLE is closed for time $\Delta t_{sample}$ while the input voltage is periodically switched between levels $V_{in,min}$ and $V_{in,max}$ when switch SAMPLE is open. Each time switch SAMPLE is closed, the voltage $V_s$ on the sampling capacitor must settle from the previous sampled value to the new one. The settled voltage output levels corresponding to $V_{in,min}$ and $V_{in,max}$ sampled on $C_s$ are $V_{s,min}$ and $V_{s,max}$. If $V_s$ is at a minimum voltage $V_{s,min}$, then when switch SAMPLE closes $V_s$ increases from voltage $V_{s,min}$ to a voltage $V_{s,max}$. This illustrates the relatively fast settling for a low-to-high transition. Note that the transient current pulling $V_s$ from $V_{s,min}$ to $V_{s,max}$ is a function of the drive strength of M1 and can be substantially higher than the bias current $I_{bias}$. If $V_s$ is at maximum voltage $V_{s,max}$, then when switch SAMPLE closes, $V_s$ decreases from $V_{s,max}$ to $V_{s,min}$. The settling for a high-to-low transition is significantly slower because the transient current pulling $V_s$ from $V_{s,max}$ to $V_{s,min}$ (known also as the slew current $I_{slew}$) is limited by the bias current $I_{bias}$ provided by M2. Since $I_{slew}=I_{bias}=$const, $V_s(t)$ decreases linearly at a rate known as the slew rate and given by $I_{slew}/C_s$. This portion of the settling time is known as slewing time. If the slewing time is assumed to be, for example, 80% of the available settling time $\Delta t_{sample}$, then the required source follower bias current is:

$$I_{bias} = I_{slew} = \frac{C_s(V_{s,max} - V_{s,min})}{0.8\Delta t_{sample}}. \quad (1)$$

Equation (1) shows that the bias current must be sized to achieve settling within $\Delta t_{sample}$ for the largest expected voltage swing $V_{s,max}-V_{s,min}$. Given randomly distributed input voltages, the signal swing will be less than that on average, but the bias current must be set high enough to satisfy the worst case. This highlights the energy inefficiency of the classic source follower circuit. It can be shown that the static and dynamic energies (E) consumed from the supply per period $\Delta t$ by the source follower circuit of FIG. 1A are as follows:

$$\text{Static } E = (I_{bias})(V_{dd})(\Delta t_{sample}) = \frac{C_s(V_{s,max} - V_{s,min})V_{dd}}{0.8}; \quad (2a)$$

$$\text{Dynamic } E = 0 \text{ (on average)}. \quad (2b)$$

The high-to-low transition can be improved by 'precharging' sampling capacitor $C_s$ to ground before the SAMPLE switch closes; this is illustrated in FIGS. 2A and 2B. The precharging is accomplished with a switch CLR connected across capacitor $C_s$. As shown in FIG. 2B, switch CLR is closed —and thus $C_s$ is precharged (or reset) to ground —before switch SAMPLE is closed. When so arranged, $C_s$ does not have to be discharged by the source follower bias transistor M2 when $V_{in}$ falls, thereby eliminating the slew-limited settling and the slow high-to-low transition exhibited by the circuit of FIG. 1A. The static and dynamic energies (E) consumed from the supply per period $\Delta t$ by the source follower circuit of FIG. 2A are as follows:

$$\text{Static } E = (I_{bias})(V_{dd})(\Delta t_{sample}); \quad (3a)$$

$$\text{Dynamic } E = C_s V_s V_{dd} \quad (3b)$$

While at first glance the static energy given by (3a) appears to be the same as (2a), it is in fact significantly lower because $I_{bias}$ no longer needs to equal the slew current defined by equation (1) and is in fact much smaller (typically set so that the transconductance of M1 achieves the small-signal time constant for the targeted settling time).

The dynamic energy term given by equation (3b) is proportional to the sampled voltage on the capacitor $V_s$. For the largest input voltage (and hence largest $V_s$) the static and dynamic energy consumed by the circuit of FIG. 2A approaches that of the circuit of FIG. 1A. However, for randomly distributed input voltages between ground and the largest input voltage, the circuit of FIG. 2A is more energy efficient. Nevertheless, it still has the drawback that dynamic energy is drawn from the supply even if there is no change in $V_{in}$ from sample to sample.

SUMMARY OF THE INVENTION

An energy efficient source follower circuit is presented which enables faster settling on both high-to-low and low-to-high transitions, and is particularly well-suited for driving sampled capacitive loads.

The present source follower circuit is suitable for receiving and buffering an input voltage ($V_{in}$) and providing the buffered input voltage to a sampling capacitor via a sampling switch; the voltage stored on the sampling capacitor is referred to herein as $V_s$. The source follower circuit comprises:

an output node at which an output $V_{out}$ of the source follower circuit is provided;

a slew FET having its drain connected to the output node and its source connected to a fixed potential such that, when on, the FET accelerates the slew rate of $V_{out}$ for one of a high-to-low or low-to-high transition;

a slew capacitor $C_{slew}$ connected between the output node and the slew FET's gate; and a SET switch connected between the slew FET's gate and a voltage $V_{set}$.

The source follower circuit is arranged such that:

when the SET switch is closed and the sampling switch is open, the voltage ($V_g$) at the slew FET's gate is equal to $V_{set}$, the slew FET is substantially turned off, and $V_{out}$ settles to a new value $V_{out\_new}$ which varies with $V_{in}$. When the SET switch opens and said sampling switch closes, $V_{out}$ transitions to the voltage ($V_{s\_prev}$) previously stored on the sampling capacitor, and $V_g$ changes by a value $\Delta V_g$ which is proportional to ($V_{s\_prev} - V_{out\_new}$).

When so arranged, if the slew FET is an NMOS FET and $\Delta V_g > 0$, the slew FET turns on and pulls $V_s$ down to $V_{out\_new}$, and if the slew FET is a PMOS FET and $\Delta V_g < 0$, the slew FET turns on and pulls $V_s$ up to $V_{out\_new}$.

The present source follower circuit preferably includes an input FET having its gate connected to input voltage $V_{in}$ and its source connected to output node $V_{out}$. A bias FET is preferably connected in series with the input FET, with the output node being at the junction of the input and bias FETs. This arrangement enables fast settling on both high-to-low and low-to-high transitions.

Further features and advantages of the invention will be apparent to those skilled in the art from the following detailed description, taken together with the accompanying drawings.

BRIEF DESCRIPTION OF THE DRAWINGS

FIG. 5A is a schematic diagram of one possible embodiment of a $V_{set}$ generation circuit for use with an NMOS source follower circuit per the present invention.

FIG. 5B is a schematic diagram of one possible embodiment of a $V_{set}$ generation circuit for use with a PMOS source follower circuit per the present invention.

FIG. 6 is a table comparing the simulated power consumption for a source follower circuit in accordance with the present invention with those of prior art source follower circuits.

DETAILED DESCRIPTION OF THE INVENTION

Figure 3A:
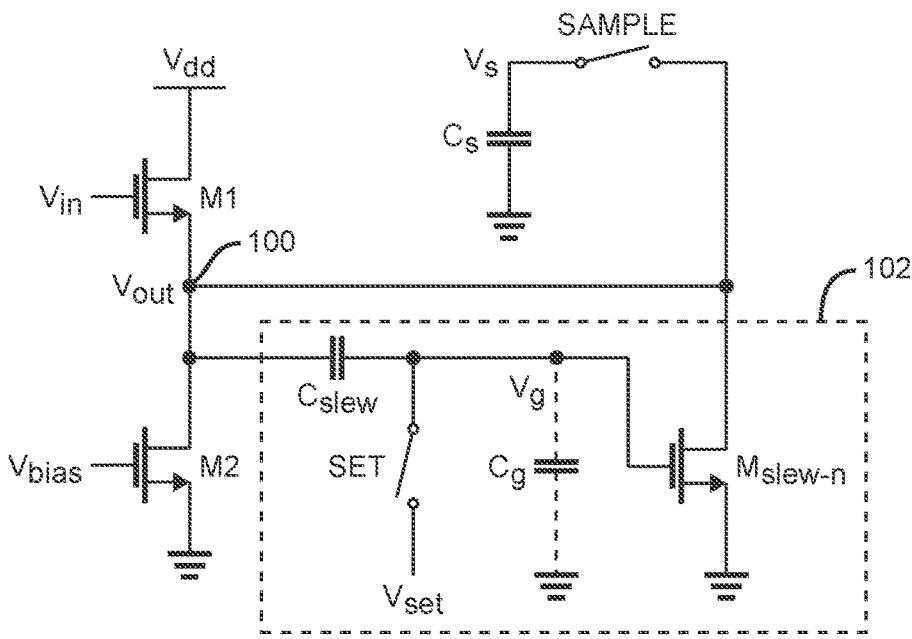
FIG. 3A is a schematic diagram of an NMOS embodiment of a source follower circuit in accordance with the present invention.

The present source follower circuit has a general applicability, but is particularly well-suited for receiving and buffering an input voltage and providing the buffered input voltage to a sampling capacitor via a sampling switch. One possible embodiment is shown in FIG. 3A. The source follower circuit preferably includes an NMOS input FET (M1) having its gate connected to input voltage $V_{in}$, its drain connected to a supply voltage $V_{dd}$, and its source connected to output node 100, and an NMOS bias FET (M2) having its gate connected to a bias voltage $V_{bias}$, its drain connected to output node 100, and its source connected to a circuit common point. M1 and M2 are thus connected in series, with output node 100 being the junction of M1 and M2. The circuit is arranged to receive and buffer an input voltage $V_{in}$, and provide the buffered voltage $V_{out}$ at an output node 100. In this exemplary embodiment, voltage $V_{out}$ is provided to a sampling capacitor $C_s$ via a sampling switch SAMPLE, with the voltage stored on the sampling capacitor being referred to herein as $V_s$.

Both NMOS and PMOS source follower circuits are described herein. The source follower circuit includes a "slew enhancement circuit" 102, which operates to enhance the slew rate of low-to-high transitions (for a PMOS source follower) or high-to-low transitions (for an NMOS source follower) of buffered voltage $V_{out}$. Circuit 102 comprises a slew FET $M_{slew-n}$ having its drain connected to output node 100 and its source connected to a fixed potential (such as ground) such that, when on, the slew FET accelerates the slew rate of $V_{out}$ for a high-to-low transition. A slew capacitor $C_{slew}$ is connected between output node 100 and the gate of $M_{slew-n}$, and a SET switch is connected between the gate of $M_{slew-n}$ and a voltage $V_{set}$.

Figure 3B:
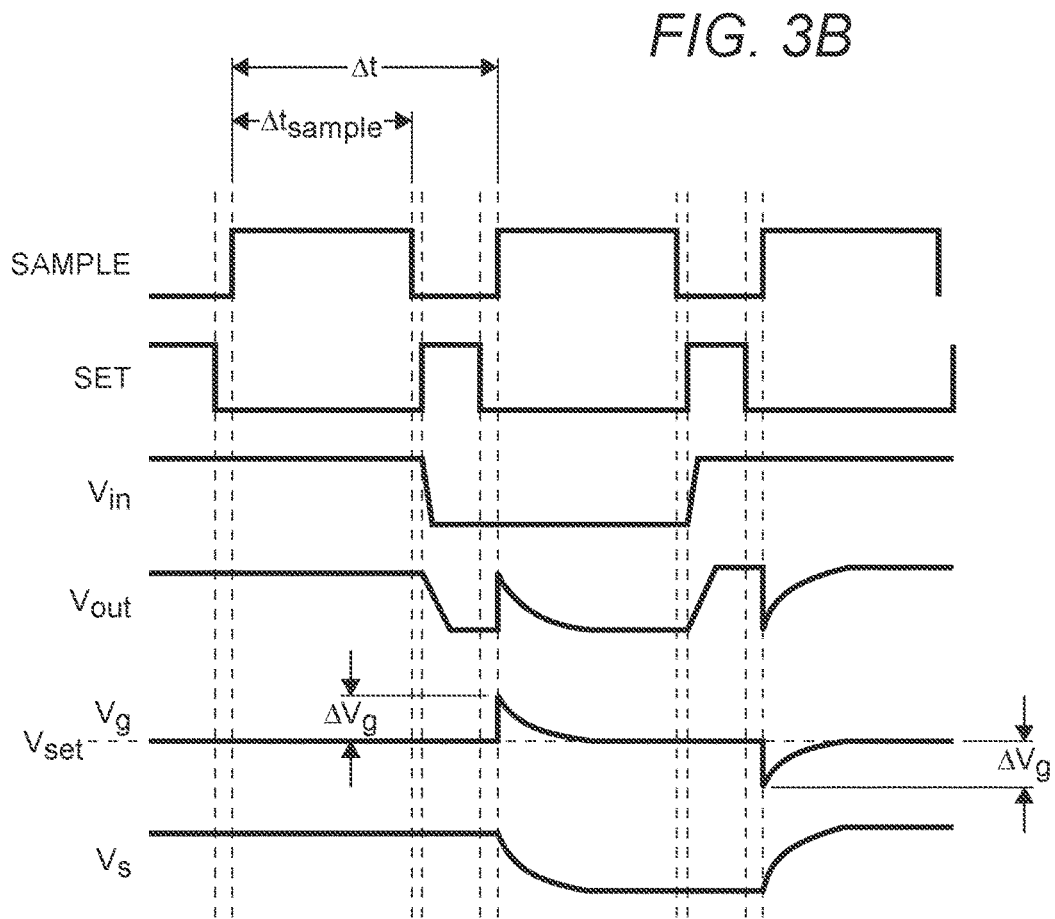
FIG. 3B is a timing diagram which illustrates the operation of the source follower circuit in FIG. 3A.

A timing diagram illustrating the operation of the circuit shown in FIG. 3A is shown in FIG. 3B. Switches SAMPLE and SET are operated with corresponding control signals SAMPLE and SET, respectively. In this example, the switches are closed when their corresponding control signal goes high; it is understood that the switches might also be arranged to operate with control signals having the opposite polarity to those shown in FIG. 3B. Signals SAMPLE and SET both have the same period $\Delta t$. Signal SAMPLE is high for a sampling time $\Delta t_{sample}$, which typically takes most of the period $\Delta t$. Signal SET is high while signal SAMPLE is low, i.e. the two signals are non-overlapping. It is also assumed that for every sampling period the input voltage $V_{in}$ transitions to the new value at the onset of the SET pulse. Let us first consider the circuit operation when switch SET is closed and switch SAMPLE is open. Under these conditions, the voltage $V_g$ at the gate of FET equal $M_{slew-n}$ is to $V_{set}$. $V_{set}$ is selected to be slightly below $V_t$, where $V_t$ is the FET turn-on threshold voltage, such that when $V_g = V_{set}$, $M_{slew-g}$ is substantially turned off. Meanwhile, the input voltage $V_{in}$ transitions to a new value $V_{in\_new}$. Since switch SAMPLE is open and the source follower is not loaded by the sampling capacitor $C_s$, the output voltage $V_{out}$ quickly settles to a new value $V_{out\_new}$ corresponding to $V_{in,new}$ while switch SET is still closed.

Next, switch SET opens and switch SAMPLE closes. This connects node 100 to $C_s$, forcing $V_{out}$ to jump from $V_{out\_new}$ to the voltage $V_{s\_prev}$ previously stored on C5. The slew capacitor $C_{slew}$ couples this voltage transition to the gate of FET $M_{slew-n}$ so that the voltage $V_g$ at the gate of $M_{slew-n}$ changes by a value $\Delta V_g$ which is proportional to ($V_{s\_prev}$−$V_{out\_new}$). Specifically, $$\Delta V_g = \frac{C_{slew}}{C_{slew}+C_g}\frac{C_s}{C_s+C_{eq}}(V_{s\_prev}+V_{out\_new}), \qquad (4a)$$

where $$C_{eq} = C_{p,out} + \frac{C_{slew}C_g}{C_{slew}+C_g}. \qquad (4b)$$

Capacitor $C_g$ is optional. $C_g$ may be an actual capacitor connected between the gate of $M_{slew-n}$ and a fixed potential such as ground (as illustrated in FIG. 3A), or may be the gate-to-source capacitance of $M_{slew-n}$. $C_{p,out}$ is the parasitic capacitance at $V_{out}$ (output node 100). Typically $C_{eq} \ll C_s$ and equation (4a) can be approximated by:

$$\Delta V_g \cong \frac{C_{slew}}{C_{slew}+C_g}(V_{s\_prev}+V_{out\_new}). \qquad (5)$$

If $V_{in}$ has transitioned from high to low, then $V_{s\_prev} > V_{out\_new}$ and $\Delta V_g > 0$. Consequently, $M_{slew-n}$ turns on and provides the current needed to pull the sampling capacitor $C_s$ from $V_{s\_prev}$ down to $V_{out\_new}$. This serves to increase the slew rate and speed up the settling for a high-to-low transition of $V_{out}$, as well as $V_s$.

On the other hand, if $V_{in}$ has transitioned from low to high, then $V_{s\_prev} < V_{out\_new}$ and $\Delta V_g < 0$. In this case $M_{slew-n}$ remains off and plays no role. However, the gate-to-source voltage of the input FET M1 increases, it turns on harder and provides the current needed to pull the sampling capacitor $C_s$ from $V_{s\_prev}$ up to $V_{out\_new}$. Thus, the slew-enhanced NMOS source follower circuit exhibits fast settling on both high-to-low and low-to-high transitions. This is to be contrasted with the conventional source follower which, for the same bias current, exhibits equally fast settling only in one direction.

Figure 4A:
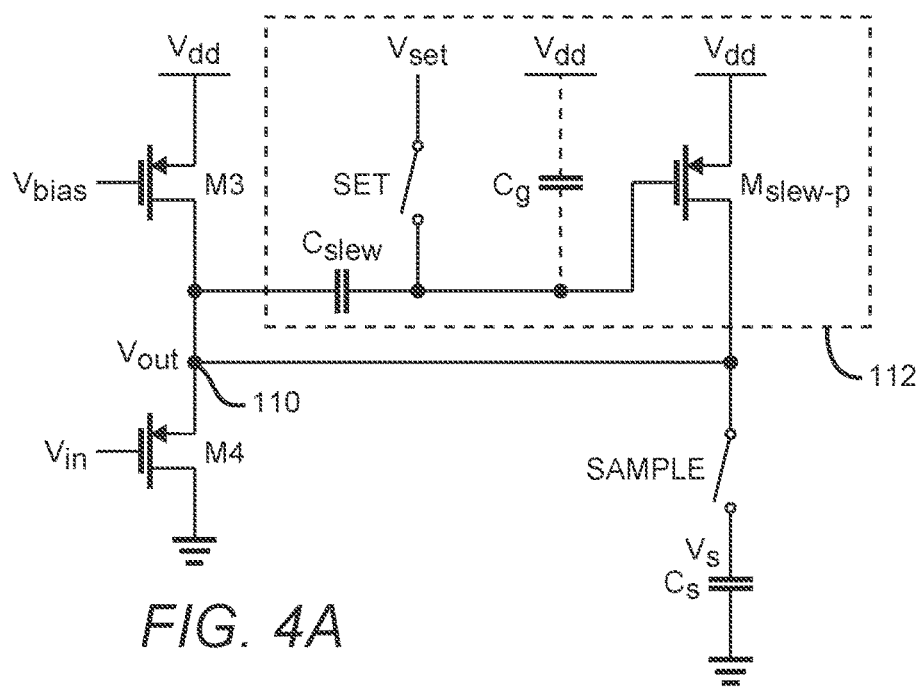
FIG. 4A is a schematic diagram of a PMOS embodiment of a source follower circuit in accordance with the present invention.

The circuit shown in FIG. 3A illustrates the application of slew enhancement to an NMOS source follower according to the present invention. It is also possible to apply slew enhancement to a PMOS source follower; one possible embodiment is shown in FIG. 4A, with a corresponding timing diagram shown in FIG. 4B. The source follower circuit preferably includes a PMOS input FET (M4) having its gate connected to input voltage $V_{in}$, its drain connected to a circuit common point, and its source connected to output node 110, and a PMOS bias FET (M3) having its gate connected to a bias voltage $V_{bias}$, its drain connected to output node 110, and its source connected to supply voltage $V_{dd}$. M3 and M4 are thus connected in series, with output node 110 being the junction of M3 and M4. As before, voltage $V_{out}$ is provided to a sampling capacitor $C_s$ via a sampling switch SAMPLE, with the voltage stored on the sampling capacitor being referred to as $V_s$. A slew enhancement circuit 112 may be realized as shown, with a slew FET $M_{slew-p}$, switch SET and slew capacitor $C_{slew}$, preferably coupled to an output node 110.

Figure 4B:
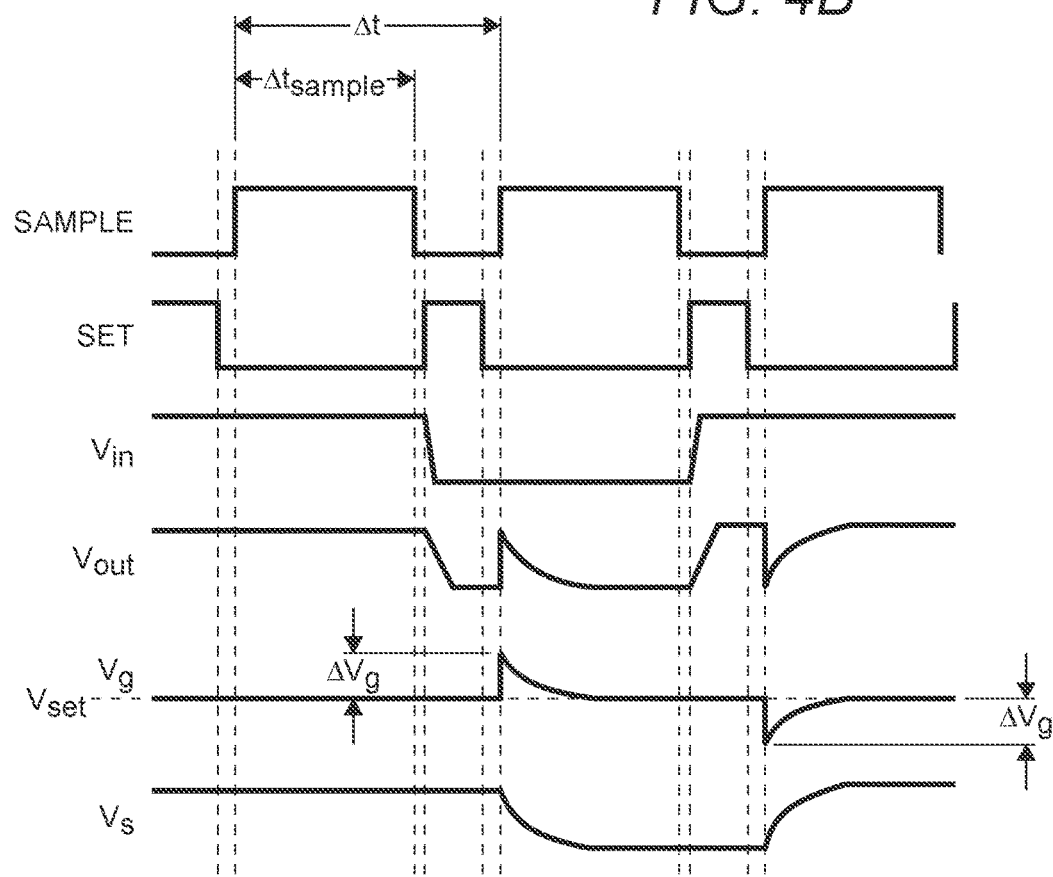
FIG. 4B is a timing diagram which illustrates the operation of the source follower circuit in FIG. 4A.

Signals SAMPLE, SET and $V_{in}$ in FIG. 4B are defined identically as in FIG. 3B. Let us first consider the circuit operation when switch SET is closed and switch SAMPLE is open. Under these conditions, the voltage $V_g$ at the gate of FET $M_{slew-p}$ is equal to $V_{set}$. $V_{set}$ is selected to be slightly above ($V_{dd}-V_t$), where $V_t$ is the FET turn-on threshold voltage, such that when $V_g=V_{set}$, $M_{slew-p}$ is substantially turned off. Meanwhile, the input voltage $V_{in}$ transitions to a new value $V_{in\_new}$. Since switch SAMPLE is open and the source follower is not loaded by the sampling capacitor $C_s$, the output voltage $V_{out}$ quickly settles to a new value $V_{out\_new}$ corresponding to $V_{in,new}$ while switch SET is still closed.

When switch SET opens and switch SAMPLE closes, output node 110 is connected to $C_s$, such that $V_{out}$ transitions to the voltage $V_{s\_prev}$ previously stored on $C_s$. The voltage $V_g$ at the gate of $M_{slew-p}$, changes by a value $\Delta V_g$ which is given by equation (4a) or approximately by equation (5). If $V_{in}$ has transitioned from low to high, then $V_{s\_prev} < V_{out\_new}$ and $\Delta V_g < 0$. Consequently, $M_{slew-p}$ turns on and provides the current needed to pull the sampling capacitor $C_s$ from $V_{s\_prev}$ up to $V_{out\_new}$. This serves to increase the slew rate and speed up the settling for a low-to-high transition of $V_{out}$, as well as $V_s$. On the other hand, if $V_{in}$ has transitioned from high to low, then $V_{s\_prev} > V_{out\_new}$ and $\Delta V_g > 0$. In this case $M_{slew-p}$ remains off and plays no role. However, the gate-to-source voltage of the input FET M4 increases, it turns on harder and provides the current needed to pull the sampling capacitor $C_s$ from $V_{s\_prev}$ down to $V_{out\_new}$. Thus, the slew-enhanced PMOS source follower circuit exhibits fast settling on both high-to-low and low-to-high transitions.

As noted above, $V_{set}$ is selected to be slightly below $V_t$ when the slew FET is NMOS, and selected to be slightly above ($V_{dd}-V_t$) when the slew FET is PMOS. Possible embodiments of circuits capable of generating $V_{set}$ for NMOS and PMOS source follower circuits are shown in FIGS. 5A and 5B, respectively. In FIG. 5A, the generation circuit preferably comprises a diode-connected NMOS FET M5, driven with a bias current $I_{bias}$. If $I_{bias}$ is small and M5's width-to-length (W/L) ratio is large, $V_{set} < V_t$. After the SET switch (preferably implemented with an NMOS FET) opens, clock feedthrough and switch charge injection may cause a small voltage error $-\Delta V$, so that $V_g = V_{set} - \Delta V$.

In FIG. 5B, the generation circuit preferably comprises a diode-connected PMOS FET M6, driven with a bias current $I_{bias}$. If $I_{bias}$ is small and M6's width-to-length (W/L) ratio is large, $V_{set} > (V_{dd}-V_t)$, where $V_{dd}$ is the circuit supply voltage. After the SET switch (preferably implemented with a PMOS FET) opens, switch clock feedthrough and charge injection may cause a small voltage error $+\Delta V$, so that $V_g = V_{set} + \Delta V$.

Preferred embodiments of the SET switches shown in FIGS. 3A and 4A are also shown in the $V_{set}$ generation circuits, with the SET switch in FIG. 5A implemented with an NMOS FET M7, and the SET switch in FIG. 5B implemented with an PMOS FET M8.

Below are some additional notes on the operation of the slew-enhanced source follower.

Capacitance $C_{slew}$ can be much smaller than $C_s$. Typical values could be, for example, $C_{slew}$=20 fF and $C_s$=1 to 10 pF. As noted above, capacitor $C_g$ may be optional; if used, it provides attenuation to $\Delta V_g$.

$V_{set}+\Delta V_g$ when $\Delta V_g<0$ should not fall below $-V_t$ for an NMOS embodiment of the present source follower circuit. Similarly, $V_{set}\Delta V_g$ when $\Delta V_g>0$ should not rise above $V_{dd}+V_t$ for a PMOS embodiment. Capacitances $C_{slew}$ and $C_g$ can be ratioed to ensure that this is true for the largest signal swing. For example, assuming that $V_{set}\approx V_t$ for the NMOS implementation and $V_{set}\approx V_{dd}-V_t$ for the PMOS implementation, using equation (5) we can write:

$$|\Delta V_g| \cong \frac{C_{slew}}{C_{slew}+C_g}(V_{s\_max}-V_{s\_min}) \leq 2V_t, \quad (6)$$

where $V_{s,min}$ and $V_{s,max}$ are respectively the minimum and maximum sampled voltages on capacitor $C_s$. Solving for $C_g/C_{slew}$ we obtain:

$$\frac{C_g}{C_{slew}} \geq \frac{V_{s,max}-V_{s,min}}{2V_t} - 1. \quad (7)$$

Referring to FIG. 3A, FETs M1 and M2 are preferably in close proximity to slew enhancement circuit 102, to minimize the parasitic capacitance $C_{p,out}$ at $V_{out}$ (output node 100). This is because as $C_{p,out}$ increases, $C_{eq}$ increases (equation (4b)) and $\Delta V_g$ decreases (equation (4a)), thus reducing the effectiveness of the slew enhancement. Similarly, for the PMOS embodiment in FIG. 4A, FETs M3 and M4 are preferably in close proximity to slew enhancement circuit 112.

Figure 1A:
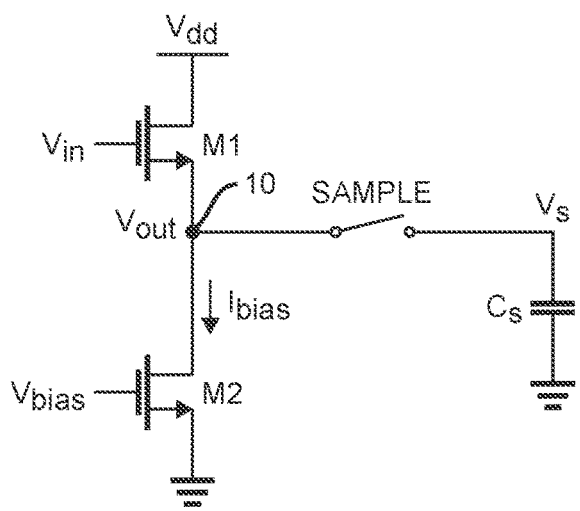
FIG. 1A is a schematic diagram of a known source follower circuit.
Figure 1B:
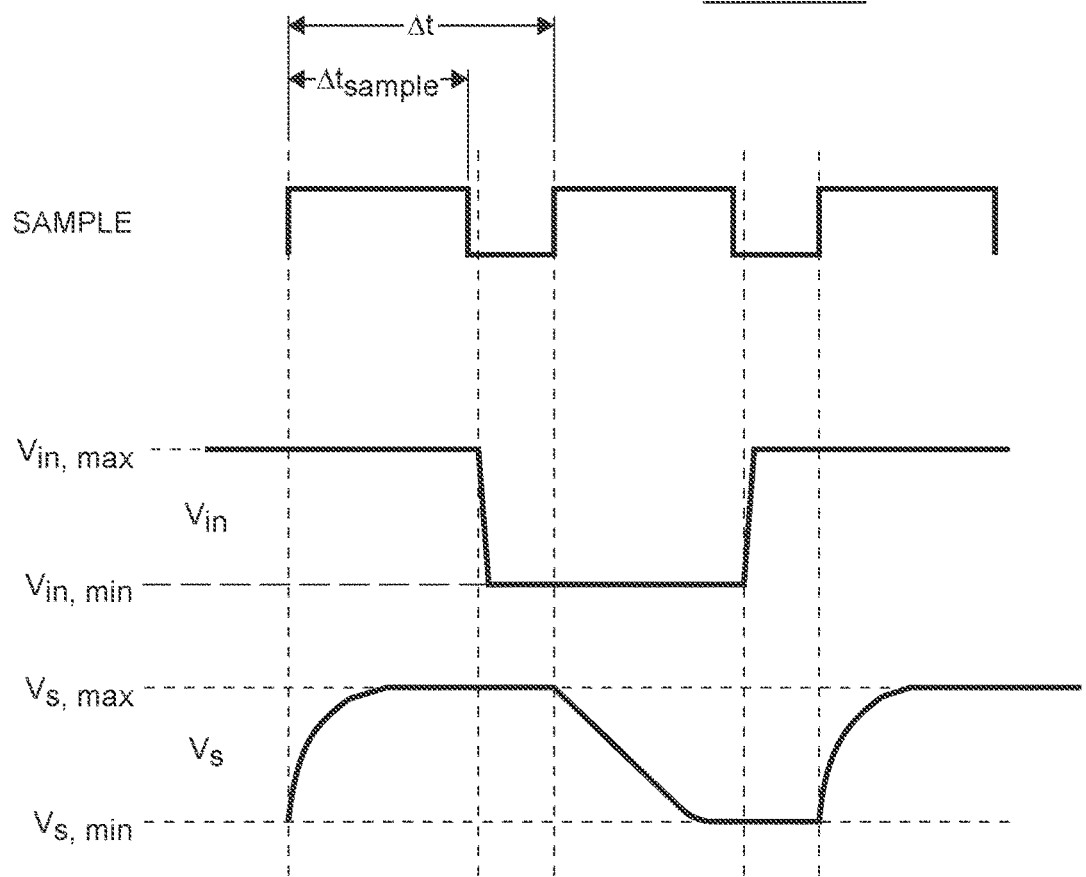
FIG. 1B is a timing diagram which illustrates the operation of the source follower circuit in FIG. 1A.
Figure 2A:
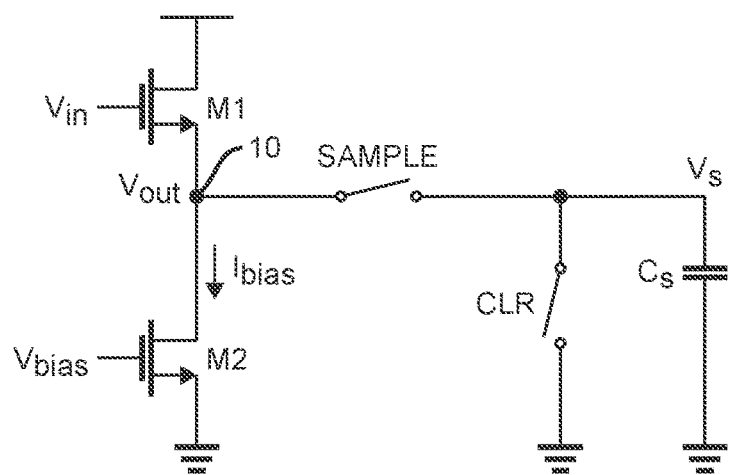
FIG. 2A is a schematic diagram of another known source follower circuit.
Figure 2B:
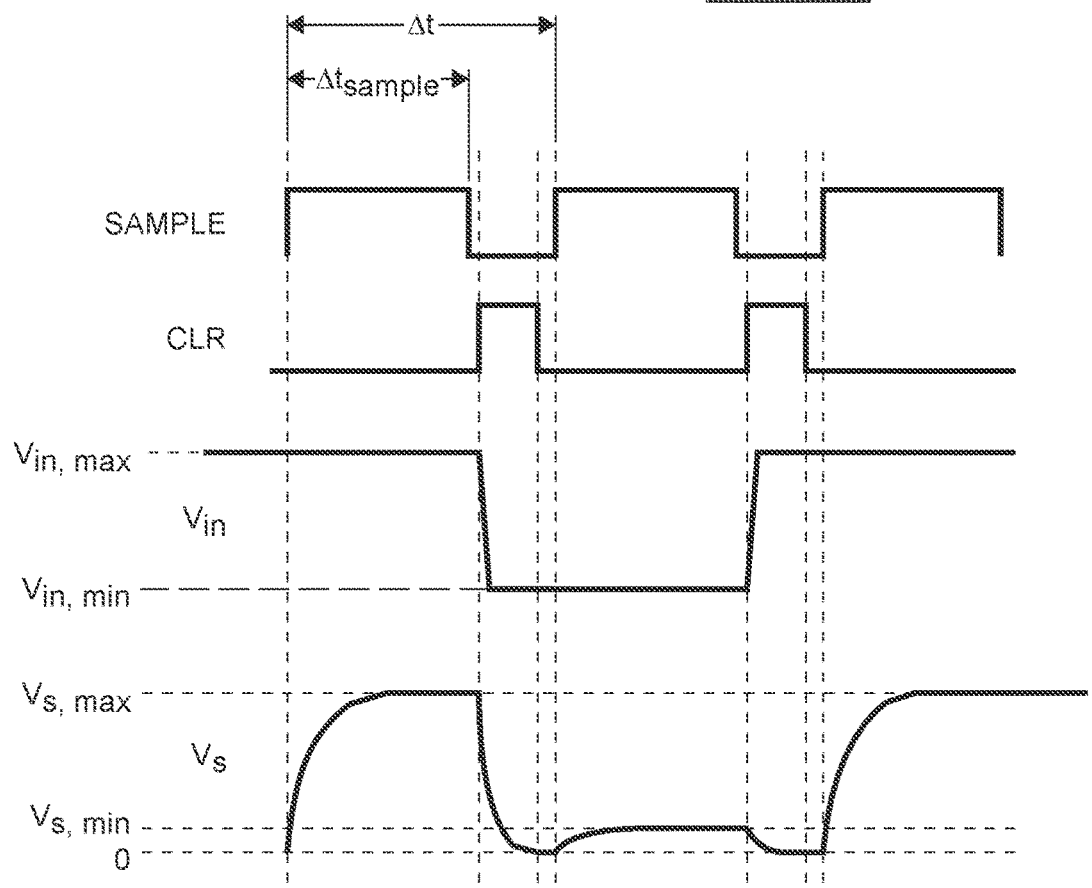
FIG. 2B is a timing diagram which illustrates the operation of the source follower circuit in FIG. 2A.

A source follower circuit as described herein provides numerous advantages in comparison to prior art circuits. While the conventional NMOS source follower of FIG. 1A has fast settling only on low-to-high transitions, the slew-enhanced NMOS source follower of FIG. 3A operated at a similar bias current achieves fast settling on both low-to-high and high-to-low transitions. If the source follower of FIG. 1A is to have similarly fast high-to-low settling then its bias current needs to be increased significantly to provide the needed slew current but it will then be much less energy efficient than the slew-enhanced source follower. The same conclusions are valid if a conventional PMOS source follower is compared with the slew-enhanced source follower of FIG. 4A. When compared to the source follower with precharge of FIG. 2A, the slew-enhanced source follower circuit shows better energy efficiency since the charge on the sampling capacitor is not reset every sampling period. In fact, dynamic current is drawn from the supply only when needed and as much as needed for the sampling capacitor to settle to the new voltage. Consequently, the slew-enhanced source follower operates with a lower average dynamic current than the source follower with precharge of FIG. 2A. This leads to reduced power dissipation, as well as less substrate, ground or supply noise. The power savings provided by the present source follower circuit can be significant, particularly when used with, for example, multiple parallel circuits (for example, pixel or column source followers in image sensors), or when driving relatively large capacitive loads (for example, on-chip or output drivers). The improvement in energy efficiency will be discussed in more detail next.

FIG. 6 is a table comparing simulated typical power consumption values for the present slew-enhanced source follower circuit (rightmost column) and the source follower circuits depicted in prior art FIGS. 1A (leftmost column) and 2A (center column). Though bias current is slightly higher for the present circuit in comparison with the circuit of FIG. 2A, the values for average $V_{dd}$ current and, consequently, average power, are considerably lower for the present circuit. The last row shows that the total power savings are significant when each of the three circuits is used in a 4096×4096 pixel array. The following assumptions were made when creating FIG. 6:

Spectre simulation over 1000 sampling periods;
the input $V_{in}$ for each sample is random and uniformly distributed over the range from 0 to 2.0 V;
the supply voltage $V_{dd}$=3.3 V;
the sampling capacitor $C_s$=1 pF;
the sampling time $\Delta t_{sample}$=11 μs and the sampling period $\Delta t$=11.5 μs;
a PMOS source follower is used.
when reporting the average power in a 4096×4096 array, it is assumed that the source follower is powered up for the sampling period $\Delta t$=11.5 is and is powered down for the rest of the frame time of 1 ms.

The present source follower circuit can be used in numerous applications. In addition to those referenced above, examples include in-pixel source follower buffer circuits (for global shutter pixels, for example), source follower signal buffering (on-chip or off-chip load), and reference voltage buffering.

While particular embodiments of the invention have been shown and described, numerous variations and alternate embodiments will occur to those skilled in the art. Accordingly, it is intended that the invention be limited only in terms of the appended claims.

We claim:

1. A source follower circuit suitable for receiving and buffering an input voltage ($V_{in}$) and providing said buffered input voltage to a sampling capacitor via a sampling switch, the voltage stored on said sampling capacitor being $V_s$, comprising:
   an output node at which an output $V_{out}$ of said source follower circuit is provided;
   a slew FET having its drain connected to said output node and its source connected to a fixed potential such that, when on, said FET accelerates the slew rate of $V_{out}$ for one of a high-to-low or low-to-high transition;
   a slew capacitor $C_{slew}$ connected between said output node and said slew FET's gate; and
   a SET switch connected between said slew FET's gate and a voltage $V_{set}$;
   said source follower circuit arranged such that:
   when said SET switch is closed and said sampling switch is open,
   the voltage ($V_g$) at said slew FET's gate is equal to $V_{set}$ and the slew FET is substantially turned off; and
   $V_{out}$ settles to a new value $V_{out\_new}$ which varies with $V_{in}$;
   and when said SET switch opens and said sampling switch closes,
   $V_{out}$ transitions to the voltage ($V_{s\_prev}$) previously stored on said sampling capacitor; and
   $V_g$ changes by a value $\Delta V_g$ which is proportional to ($V_{s\_prev}-V_{out\_new}$); and
   if said slew FET is an NMOS FET and $\Delta V_g>0$, said slew FET turns on and pulls $V_s$ down to $V_{out\_new}$, and
   if said slew FET is a PMOS FET and $\Delta V_g<0$, said slew FET turns on and pulls $V_s$ up to $V_{out\_new}$.

2. The source follower circuit of claim 1, wherein said circuit further comprises an input FET having its gate connected to input voltage $V_{in}$ and its source connected to said output node $V_{out}$.

3. The source follower circuit of claim 2, further comprising a bias FET connected in series with said input FET, said output node being at the junction of said input and bias FETs.

4. The source follower circuit of claim 3, wherein said input and bias FETs and said slew FET are NMOS FETs and the source of said bias FET is connected to said fixed potential, the fixed potential to which said slew FET and said bias FET are connected being a circuit common point.

5. The source follower circuit of claim 3, wherein said input and bias FETs and said slew FET are PMOS FETs and the source of said bias FET is connected to said fixed potential, the fixed potential to which said slew FET and said bias FET are connected being a circuit supply voltage $V_{dd}$.

6. The source follower circuit of claim 3, wherein the gate of said bias FET is connected to a fixed bias voltage $V_{bias}$.

7. The source follower circuit of claim 1, further comprising a gate capacitance $C_g$ between the gate of said slew FET and a second fixed potential, such that $$\Delta V_g = \frac{C_s}{C_s + C_{eq}} \frac{C_{slew}}{C_{slew} + C_g}(V_{s\_prev} - V_{out\_new}),$$

where $$C_{eq} = C_{p,out} + \frac{C_{slew} C_g}{C_{slew} + C_g}$$

and $C_{p,out}$ is the capacitance on said output node.

8. The source follower circuit of claim 7, wherein said second fixed potential is a circuit common point if said slew FET is an NMOS FET, and said second fixed potential is a circuit supply voltage $V_{dd}$ if said slew FET is a PMOS FET.

9. The source follower circuit of claim 7, wherein said gate capacitance $C_g$ is the gate-to-source capacitance of said slew FET.

10. The source follower circuit of claim 1, further comprising a $V_{set}$ generation circuit, said $V_{set}$ generation circuit comprising a diode-connected NMOS FET biased such that $0 < V_{set} < V_t$ when said slew FET is an NMOS FET, or comprising a diode-connected PMOS FET biased such that $(V_{dd} - V_t) < V_{set} < V_{dd}$ when said slew FET is a PMOS FET, where $V_t$ is the FET turn-on threshold voltage and $V_{dd}$ is a circuit supply voltage.

11. A source follower circuit suitable for receiving and buffering an input voltage ($V_{in}$) and providing said buffered input voltage to a sampling capacitor via a sampling switch, the voltage stored on said sampling capacitor being $V_s$, comprising:
an input stage, comprising:
an input NMOS FET connected to receive said input voltage ($V_{in}$); and
a bias NMOS FET connected in series with said input NMOS FET, the gate of said bias FET connected to a fixed bias voltage $V_{bias}$;
an output node at the junction of said input and bias NMOS FETs at which an output $V_{out}$ of said source follower circuit is provided;

a slew NMOS FET having its drain connected to said output node and its source connected to a circuit common point such that, when on, said slew NMOS FET accelerates the slew rate of $V_{out}$ for a high-to-low transition;
a slew capacitor $C_{slew}$ connected between said output node and said slew NMOS FET's gate; and
a SET switch connected between said slew NMOS FET's gate and a voltage $V_{set}$;
said source follower circuit arranged such that:
when said SET switch is closed and said sampling switch is open,
the voltage ($V_g$) at said slew NMOS FET's gate is equal to $V_{set}$ and the slew NMOS FET is substantially turned off; and
$V_{out}$ settles to a new value $V_{out\_new}$ which varies with $V_{in}$;
and when said SET switch opens and said sampling switch closes,
$V_{out}$ transitions to the voltage ($V_{s\_prev}$) previously stored on said sampling capacitor; and
$V_g$ changes by a value $\Delta V_g$ which is proportional to $(V_{s\_prev} - V_{out\_new})$; and
when $\Delta V_g > 0$, said slew NMOS FET turns on and pulls $V_s$ down to $V_{out\_new}$.

12. The source follower circuit of claim 11, further comprising a $V_{set}$ generation circuit, said $V_{set}$ generation circuit comprising a diode-connected NMOS FET biased such that $0 < V_{set} < V_t$ where $V_t$ is the NMOS FET turn-on threshold voltage.

13. A source follower circuit suitable for receiving and buffering an input voltage ($V_{in}$) and providing said buffered input voltage to a sampling capacitor via a sampling switch, the voltage stored on said sampling capacitor being $V_s$, comprising:
an input stage, comprising:
an input PMOS FET connected to receive said input voltage ($V_{in}$); and
a bias PMOS FET connected in series with said input PMOS FET, the gate of said bias FET connected to a fixed bias voltage $V_{bias}$;
an output node at the junction of said input and bias PMOS FETs at which an output $V_{out}$ of said source follower circuit is provided;
a slew PMOS FET having its drain connected to said output node and its source connected to a circuit supply voltage $V_{dd}$ such that, when on, said slew PMOS FET accelerates the slew rate of $V_{out}$ for a low-to-high transition;
a slew capacitor $C_{slew}$ connected between said output node and said slew PMOS FET's gate; and
a SET switch connected between said slew PMOS FET's gate and a voltage $V_{set}$;
said source follower circuit arranged such that:
when said SET switch is closed and said sampling switch is open,
the voltage ($V_g$) at said slew PMOS FET's gate is equal to $V_{set}$ and the slew PMOS FET is substantially turned off; and
$V_{out}$ settles to a new value $V_{out\_new}$ which varies with $V_{in}$;
and when said SET switch opens and said sampling switch closes,
$V_{out}$ transitions to the voltage ($V_{s\_prev}$) previously stored on said sampling capacitor; and
$V_g$ changes by a value $\Delta V_g$ which is proportional to $(V_{s\_prev} - V_{out\_new})$, and when $\Delta V_g<0$, said slew PMOS FET turns on and pulls $V_s$ up to $V_{out\_new}$.

14. The source follower circuit of claim 13, further comprising a $V_{set}$ generation circuit, said $V_{set}$ generation circuit comprising a diode-connected PMOS FET biased such that $(V_{dd}-V_t)<V_{set}<V_{dd}$, where $V_t$ is the PMOS FET turn-on threshold voltage and $V_{dd}$ is a circuit supply voltage.

\* \* \* \* \*

UNITED STATES PATENT AND TRADEMARK OFFICE
CERTIFICATE OF CORRECTION

PATENT NO.        : 9,667,234 B1
APPLICATION NO.   : 15/349452
DATED             : May 30, 2017
INVENTOR(S)       : Mihail Milkov et al.

It is certified that error appears in the above-identified patent and that said Letters Patent is hereby corrected as shown below:

On the Title Page

Item (72), the Inventor's city should read:

-- (1) Mihail Milkov, MOORPARK, CA (US) --

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*